United States Patent [19]

Dunn

[11] Patent Number: 5,933,216
[45] Date of Patent: Aug. 3, 1999

[54] DOUBLE-SIDED PATTERNING SYSTEM USING DUAL-WAVELENGTH OUTPUT OF AN EXCIMER LASER

[75] Inventor: Thomas J. Dunn, Mohegan Lake, N.Y.

[73] Assignee: Anvik Corporation, Hawthorne, N.Y.

[21] Appl. No.: 08/951,864

[22] Filed: Oct. 16, 1997

[51] Int. Cl.⁶ .................................................. G03D 27/52
[52] U.S. Cl. .............................. 355/53; 355/71; 355/26; 355/67; 359/615
[58] Field of Search .................................. 355/43–45, 24, 355/26, 53, 67, 77, 71; 250/548; 359/615, 837

[56] References Cited

U.S. PATENT DOCUMENTS

| | | | |
|---|---|---|---|
| 3,907,430 | 9/1975 | Mann | 359/615 |
| 4,537,378 | 8/1985 | Richter | 355/26 |
| 4,653,903 | 3/1987 | Torigoe et al. | 355/53 |
| 5,185,625 | 2/1993 | Abe et al. | 355/26 |
| 5,285,236 | 2/1994 | Jain | 355/53 |
| 5,359,389 | 10/1994 | Isohata | 355/53 |

FOREIGN PATENT DOCUMENTS

| | | | |
|---|---|---|---|
| 57-58316 | 4/1982 | Japan | 355/53 |
| 57-186333 | 11/1982 | Japan | 355/53 |
| 2-126186 | 5/1990 | Japan | 355/53 |
| 7-239551 | 9/1995 | Japan | 355/53 |

*Primary Examiner*—D. Rutledge
*Attorney, Agent, or Firm*—Carl C. Kling

[57] ABSTRACT

A high-performance projection optical system uses the multiple spectral peaks of an excimer laser system by using an optical dispersive system to physically separate the broadband laser output into separate narrowband beams which can be used for imaging different substrate surfaces simultaneously. The separated narrowband beams are directed along different optical paths and used to illuminate the object planes of different, identical projection lenses. The projection lenses are designed for the narrowed bandwidth corresponding to one spectral peak of the excimer laser rather than the broadband, multiple-peak laser output This dramatically simplifies both the design and the construction of the projection lens, leading to substantial cost-savings. The conversion of the single-beam, broadband spectral output into a multiple-beam, narrowband source is accomplished by optical dispersion means consisting of either several prisms in series, one or more prisms followed by a mirror reflecting back through the prisms, or one or more reflective gratings. The separated narrowband beams are useful for imaging top and bottom of a single substrate with exact registration useful for via-hole connections. Other uses include simultaneous imaging of multiple substrates, using one or more stages.

16 Claims, 7 Drawing Sheets

DOUBLE-SIDED PATTERNING SYSTEM USING DUAL-WAVELENGTH OUTPUT OF AN EXCIMER LASER

BACKGROUND OF THE INVENTION

1. Field of the Invention

This invention relates to a high-performance optical projection system for use in patterning microelectronics circuit elements, and more particularly relates to a system which separates and uses each of the multiple spectral peaks of an excimer laser system. An optical dispersion subsystem physically separates the broadband laser output into separate narrowband beams which are directed into separate projection subsystems so that different substrate surfaces can be addressed simultaneously.

2. Background of the Invention

Economical manufacturing of the electronic and optoelectronic components requires the fabrication of a great number of microscopic structures on a single large substrate. These structures can be active devices, such as transistors in a flat panel display (FPD) or integrated circuit (IC). The structures may also be passive patterns, such as interconnecting conductors on a printed circuit board (PCB) or multi-chip module (MCM). The large substrate can be a board, a display panel, a silicon wafer, or roll of flexible substrate material. Both the feature size and the substrate size can vary greatly depending on the application. The actual substrates used can vary from several square inches for small modules to several square feet for PCB's and FPD's. Common to all of the applications is the requirement that the system used to produce them has the required resolution over the entire substrate.

To achieve economical manufacturing, the high cost of production equipment must be offset by high throughput. To increase throughput and yield, substrate handling must be minimized to reduce the overall processing time, and also to avoid damage and contamination. This may be accomplished by processing both surfaces of the substrate simultaneously, with perfect alignment between them so that electrical connections may be made from the top surface pattern to the bottom surface pattern by interconnections called plated via-holes.

There is a great need for the development of patterning equipment for the fabrication of electronic products which combines these major performance attributes: high processing throughput, high resolution, the ability to handle large substrate sizes, and the ability to accurately and economically pattern both sides of a substrate simultaneously. An imaging technology which achieves many of these objectives has been described by K. Jain in U.S. Pat. No. 5,285,236, Large-Area, High-Throughput, High-Resolution Projection Imaging System issued Feb. 08, 1994. The referenced patent discloses a projection imaging system in which an integrated stage assembly for both the mask and substrate is used for the seamless exposure of a large-area substrate with high resolution and at a high-throughput. This technology was extended to include two-sided exposure of substrates in pending patent application of K. Jain, Ser. No. 08/889,307, filed Jul. 7, 1997, Simultaneous, Two-Sided, Projection Lithography System. The patent application by K. Jain uses a beamsplitter to generate two beams for exposing the two sides of a substrate.

In this patent the inventor describes how it is possible to further reduce the costs of a lithography system which is used for two-sided exposure of substrates. The required resolution capability of a projection optical system is one of the key parameters that determines the overall cost of a lithography machine. The theoretical resolution, R, of a projection lens is governed by the equation:

$$R = \frac{k_1 \lambda}{N.A.} \quad \text{Eq. 1}$$

Where $\lambda$ is the illumination wavelength, N.A. is the numerical aperture of the lens, and $k_1$ is a processing parameter. The shorter the illumination wavelength, the better the resolution capability of the lens for a given N.A. This has led to the design of projection lenses which are optimized for the ultraviolet (UV) wavelength regime. One of the problems facing equipment manufacturers of microlithography machines is the choice of materials for fabricating projection lenses optimized for the UV regime.

High-resolution lithography lenses which are fabricated from only one optical material, such as fused silica, are generally limited in their optical performance by chromatic aberrations. The chromatic dispersion of the lens material results from changes in the effective index of refraction that depend on the wavelength of light. All excimer lasers which are used as UV sources have a radiation spectrum which is sufficiently broad to degrade the optical performance of the lens as a result of the chromatic dispersion of the lens material.

There are two approaches to limiting the effects of chromatic dispersion in lithography lenses: the first approach is to use additional materials to balance the dispersion; and the second approach is to restrict the range of wavelengths from the illumination source. Both of these approaches are described in more detail.

The first approach is to use more than one optical material in the design and construction of the lens. The additional material is chosen so that its dispersion properties balance the dispersion in the original material and minimize the overall chromatic aberrations. This approach is commonly used in the design and construction of optical systems that operate in the infrared and visible regimes where there are a wide variety of suitable materials from which to choose. This approach is more difficult to implement in the ultraviolet wavelength range since there are very few suitable materials. Materials for UV lithographic applications must have low absorption, and must exhibit high homogeneity. This requires that the materials be very pure and free from defects or inclusions; this eliminates most materials as possible candidates.

The second approach to managing the chromatic aberrations of lithography lenses is to reduce the spectrum of the light source. This often leads to a significant reduction in the output power of the source. In the case of KrF lasers the output power is reduced by an order of magnitude. The reduction of the linewidth is often accomplished by the insertion into the laser cavity of additional optical elements which can suffer damage from the high intra-cavity powers which are present. The line-narrowing mechanisms are also sensitive to small thermal changes so that it becomes necessary to actively monitor and control the wavelength output to keep the peak of the emission spectrum from changing. This adds additional complexity to the system design.

There are some excimer laser sources which have multiple peaks in their radiation spectrum with broad ranges in the relative intensity of the peaks. Xenon Fluoride (XeF) lasers, however, have a radiation spectrum in which the power is equally distributed between two different spectral peaks at 351.0 nm and 353.1 nm. This invention separates the dual peaks from the same XeF laser, generating two radiation beams which are used in separate optical systems to illuminate the top and bottom surfaces of a single substrate. One beam generated from the first spectral peak illuminates a mask in the object field of a projection optical system to expose one side of a two-sided substrate, while the radiation from the second peak is used to illuminate a different mask in the object field of an identical projection optical system to expose the other side of a two-sided substrate. This approach reduces the spectrum seen by each optical projection system to a single narrowband source without sacrificing any of the available power from the laser system.

SUMMARY OF THE INVENTION

The object of this invention is to effectively reduce the bandwidth of the emitted radiation from a XeF laser used as an illumination source for a microlithography manufacturing tool. This is accomplished by using a dispersive system which spatially separates the dual frequencies that constitute the laser spectrum. The separated beams are directed through separate optical systems to simultaneously pattern two sides of a single substrate.

A feature of the invention is the use of prisms in series to spectrally disperse the optical output of a XeF laser generating two physically separated beams so that they may be directed into separate optical paths for patterning different substrate surfaces.

An alternative feature is the use of reflective diffraction gratings instead of prisms, to generate two separate beams.

An advantage of the invention is that it most effectively utilizes the available power of the laser system and is not susceptible to damage or power loss which occurs with other bandwidth-reducing schemes.

Another advantage of the invention is that it is not susceptible to environmental changes. This means that it can be a purely passive system without requiring any monitoring of the spectral characteristics of the beam. Unlike other bandwidth reducing schemes, no feedback electronics are required.

Another advantage of the invention is that it minimizes chromatic aberrations induced by the lithography projection lens by effectively reducing the bandwidth of the laser source. This advantage significantly reduces the complexity of the design and manufacturability of the projection lens.

Another advantage of the invention is that it automatically generates two separate optical beams of equal irradiance, which may be used for patterning different sides of a single substrate.

Other objects features and advantages of the invention will be apparent from the following written description, claims, abstract, and attached drawings.

DETAILED DESCRIPTION OF THE PREFERRED EMBODIMENT

Figure 1:
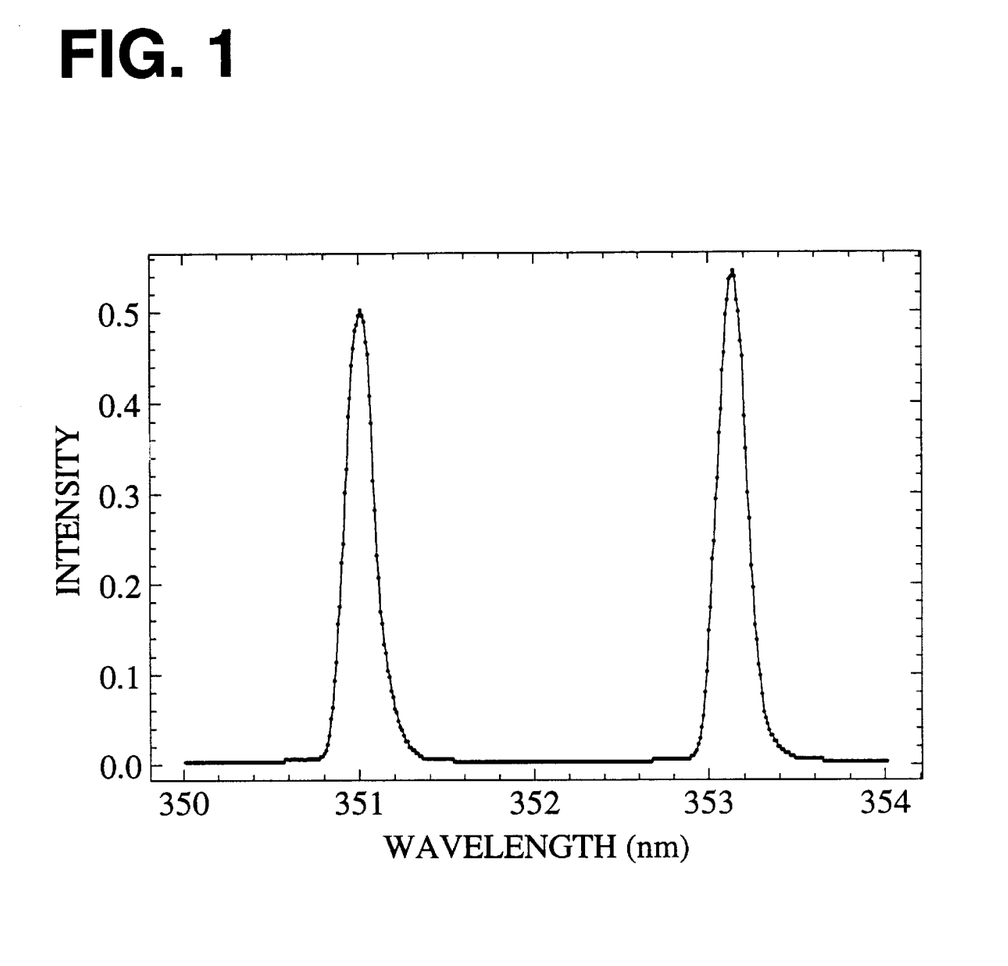
FIG. 1 shows the intensity as a function of wavelength (spectrum) of a typical Xenon Fluoride laser under normal operating conditions.

We show in FIG. 1 a typical dual-peak spectrum of the output of a XeF excimer laser that is used as a light source for lithography applications. The spectrum consists of two distinct peaks; one is centered at 351.0 nm while the other is centered at 353.1 nm. This data was taken with a scanning monochrometer which measured the spectrum from a high-powered excimer laser which is capable of generating 75 Watts of total power at a maximum repetition rate of 300 Hz. Note that the total energy is equally split between the two different spectral peaks.

Figure 2:
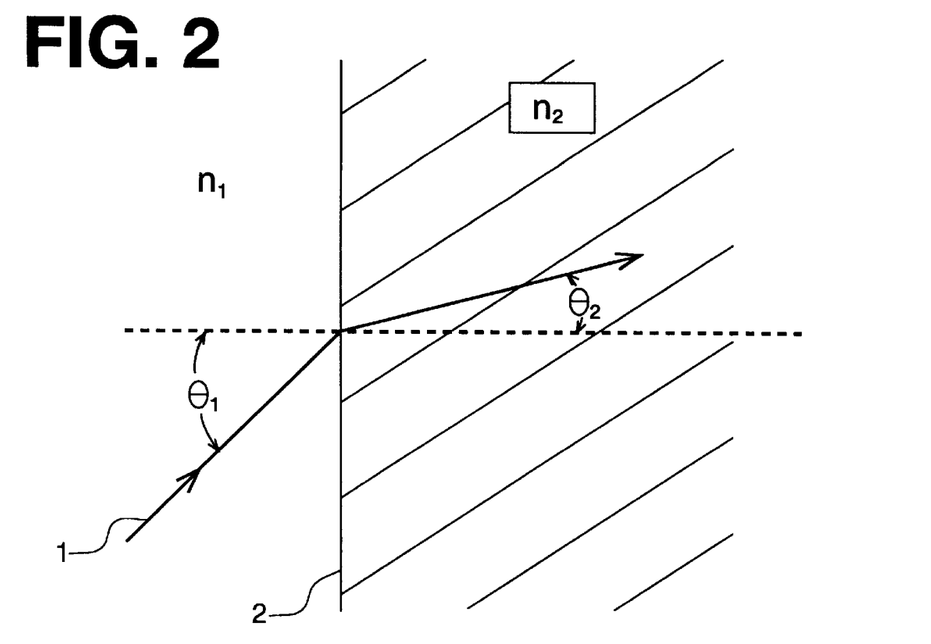
FIG. 2 illustrates the principle of refraction at an air-glass interface.

In order to separate the two spectral peaks in the laser output it is necessary to use dispersive optics. Prisms are commonly used with laser systems to spatially separate light according to its spectral constituents. When a laser beam 1 is transmitted through an air/glass interface 2 as shown in FIG. 2, the angle of the refracted radiation is given by Snell's Law[1]:

$$n_1 \sin \theta_1 = n_2 \sin \theta_2$$

where $n_1$ is the index of refraction in air, $\theta_1$ is the angle of incidence on the air-glass interface, $n_2$ is the index of the glass, and $\theta_2$ is the refracted angle after the interface. Materials which are highly dispersive will show a large change in the index of refraction for small changes in the radiation wavelength so the light will be refracted by different angles. The material dispersion of a prism will lead to the angular separation of the different spectral components of the incident radiation. See for example: M. Born, and E. Wolf, Principles of Optics, Pergamon Press, Elmsford, N.Y., 1987, p. 38.

Through geometrical considerations and Snell's law it is possible to calculate the angular deviation for separating two wavelengths, separated by 2.1 nm, for several different materials. Shown in Table 1 below is the angular deviation $\Delta\theta$ between the two spectral components of a XeF laser beam transmitted through a single equilateral prism at the angle of minimum deviation.

TABLE 1

| Material | $\Delta n$ | $\Delta\theta$ | Separation Distance |
| --- | --- | --- | --- |
| Calcium Fluoride | 2.31 E -4 | 0.019° | 98.9 ft |
| Fused Silica | 3.46 E -4 | 0.029° | 64.8 ft |

TABLE 1-continued

| Material | Δn | Δθ | Separation Distance |
|---|---|---|---|
| Barium Fluoride | 3.15 E -4 | 0.027° | 69.0 ft |
| Sapphire | 5.45 E -4 | 0.071° | 26.5 ft |

The column for Δn shows the change in the index of refraction between the peaks of the XeF laser. The Table also shows the distance that is required after the prism to achieve spatial separation of the different wavelengths, assuming that the input beam is 1 cm wide. Since the distance is rather large, even for a material as dispersive as sapphire, multiple prisms can be used to reduce the separation distance.

Figure 3:
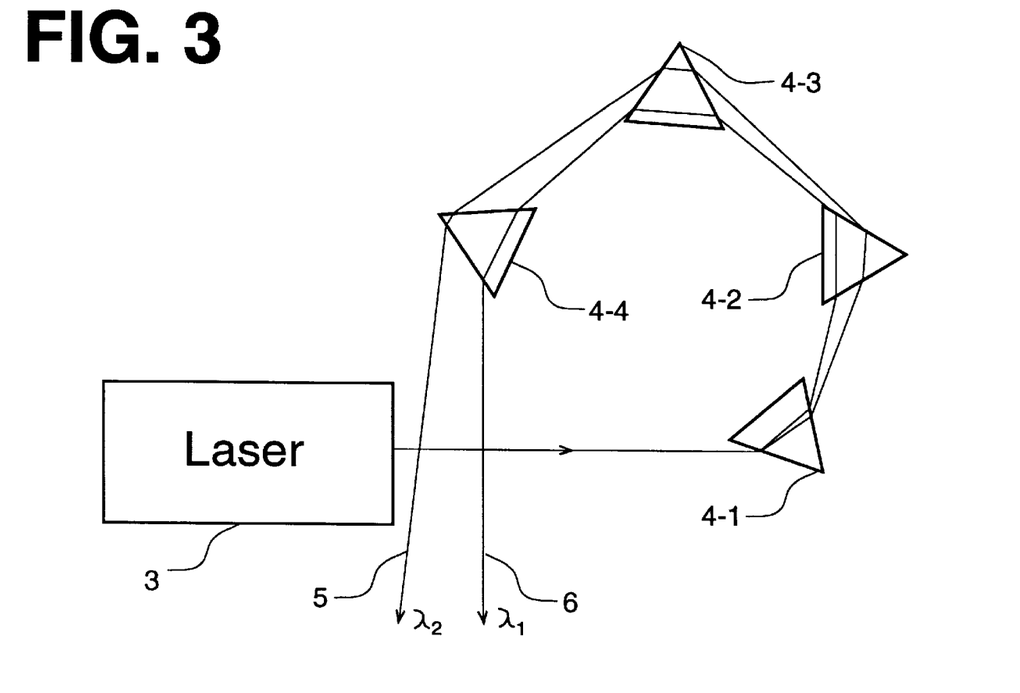
FIG. 3 shows the preferred embodiment of the invention in which multiple prisms are used to disperse the two spectral components of the laser light source.
Figure 4:
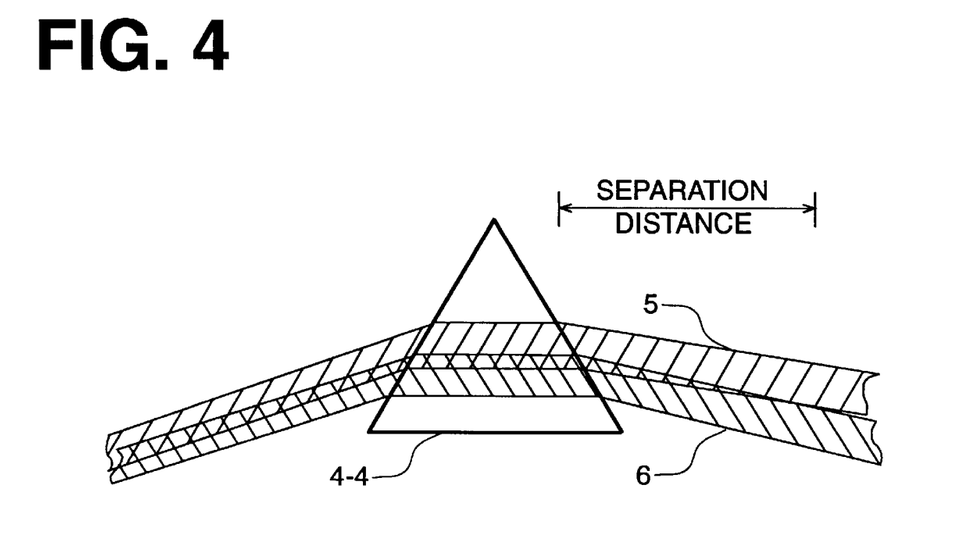
FIG. 4 shows a schematic close-up view of the dual beams after the last prism in a multiple prism sequence, and the required distance that is necessary before practical separation is possible.

We show in FIG. 3 the preferred embodiment of the invention in which four prisms 4-1, 4-2, 4-3, and 4-4 are used to reduce the separation distance. If we use sapphire prisms, then the separation distance is reduced to 6.6 ft. Each prism is used at the angle of minimum deviation so that the light propagating through the prism is parallel to the base of the prism. For the case of sapphire, each prism bends the laser beam by ~68°. After propagating through all four prisms, the laser beam has been refracted by ~271°. After the last prism, the two spectral components 4 and 5 are still spatially overlapped but the beam directions are slightly different as shown in FIG. 4. After the beams propagate by the separation distance, they will no longer overlap and can be re-directed as appropriate.

Figure 5:
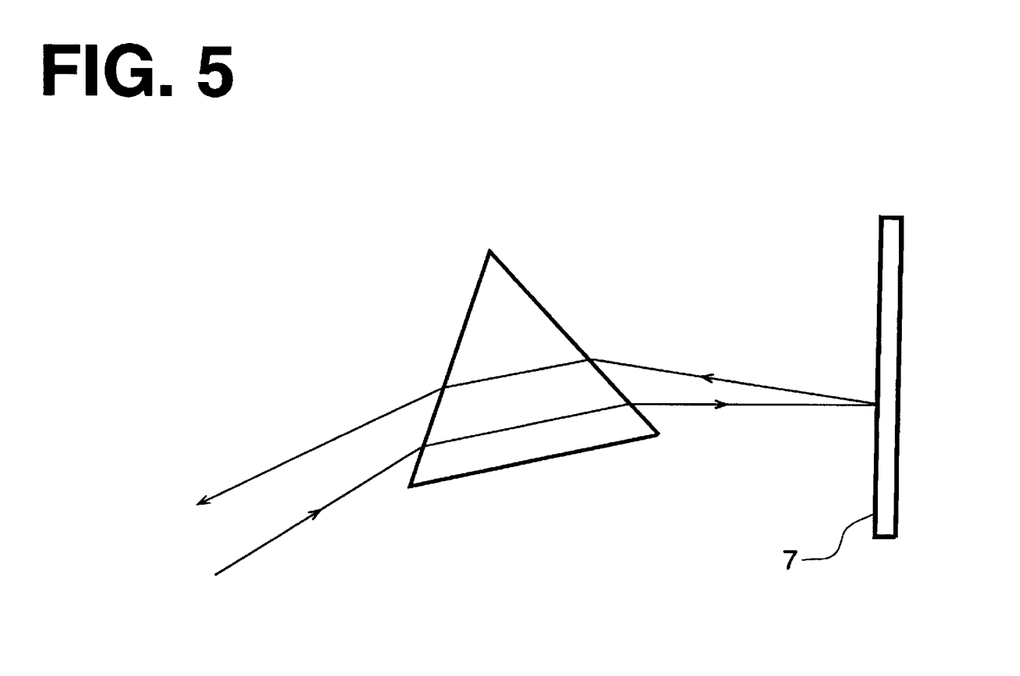
FIG. 5 shows how use of a mirror in a double-pass configuration can be used to reduce the number of required prisms by a factor of two.

Rather than using N prisms in a single pass configuration, it is possible to use N/2 prisms in a double-pass configuration as shown in FIG. 5. A flat mirror 7 is used to retro-reflect the beam back through the prism assembly. The flat mirror is aligned to be a few degrees from normal so that the beam retracing its path is separate from the input beam.

Figure 6:
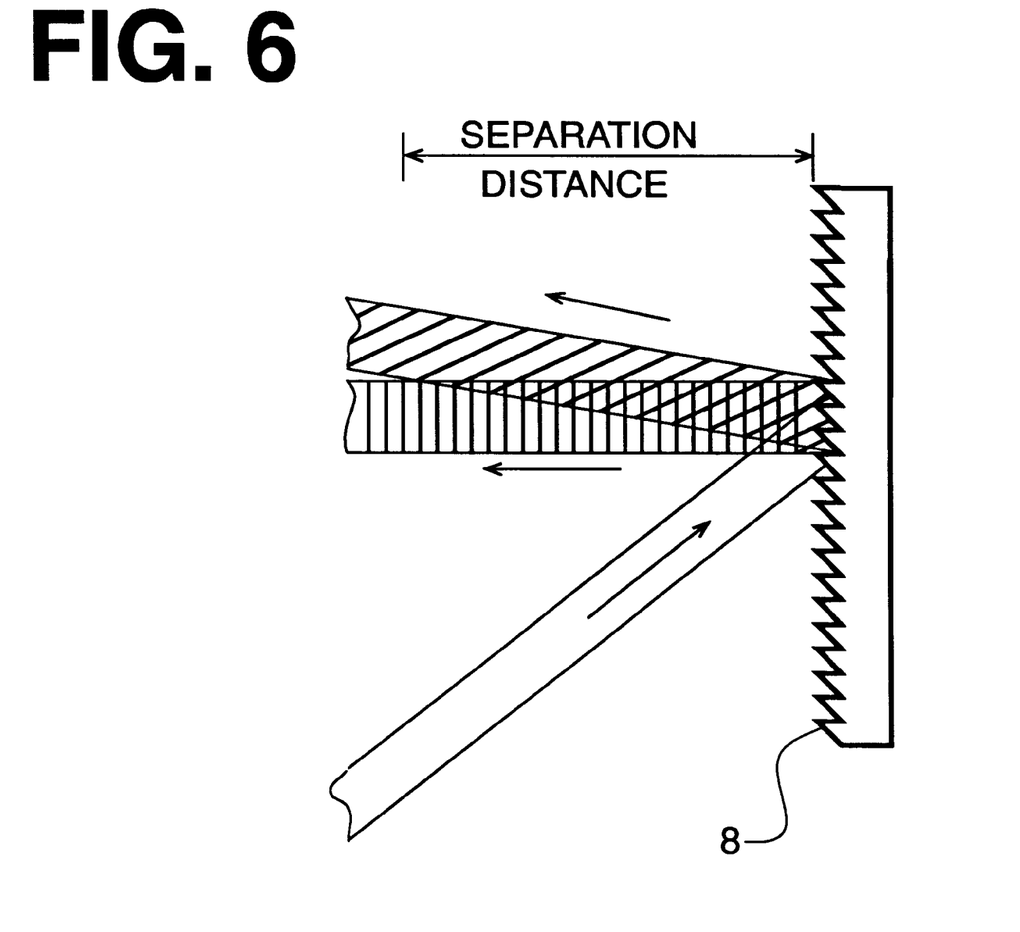
FIG. 6 shows the use of reflective diffraction gratings to separate the twin peaks into separate narrowband beams.

There are other possible means of separating the two spectral components of the excimer laser beam. One of these is the use of diffraction gratings 8 which will separate the light into its spectral components by diffraction. While diffraction gratings are considerably more dispersive, they also introduce more losses. This can be detrimental for applications where it is desired to utilize all of the available radiation.

Once the beams are separated, FIG. 1 shows that the effective spectral bandwidth will be reduced by an order of magnitude from 2.3 nm for the original dual-wavelength laser beam to less than 2 Angstroms for each of the two spectrally separated beams. This effective reduction of the spectral bandwidth will significantly simplify the design of the projection lithography lens so that only one optical material is required for lens fabrication, rather than two. Because lithography lenses are much less sensitive to wavelength variations than to bandwidth, the separated spectral beams may be handled by identical projection lenses, each constructed from a single optical material.

For microelectronics manufacturing, it is often necessary to pattern two sides of a single substrate. A previous microlithography tool uses a broadband beam splitter to divide the illumination beam into two equal intensity beams and irradiate the different sides by illuminating different masks. If a similar approach were used for a projection lithography system with a XeF light source, then it would be necessary to fabricate two lenses which would need to be minimized for chromatic aberrations. By using the spectral separation of this invention to generate the two beams of equal intensity, both beams are spectrally narrowed with respect to the original beam. Simpler identical projection lenses can then be utilized to image the masks to both sides of the substrate, leading to significant cost-savings in equipment and spare parts.

FIG. 6 shows an application of the invention in which the two spectrally separated beams 5 and 6 are used to illuminate two different masks 11 and 12 which are imaged to opposite sides of a single substrate 13. The dual-sided exposure system is similar to the system described in co-pending application of K. Jain, Ser. No. 08/889,307, filed Jul. 7, 1997. The two projection lenses 10-1 and 10-2 are identical and designed to operate with the narrowed bandwidth light source. Since one of the lenses will see illumination at 351.0 nm and the other lens will see illumination at 353.1 nm, the distance from the lens vertex to the focal plane will be slightly different. This difference can be accommodated by mechanically adjusting the lens position so that the focal plane from both lenses fall on their respective substrate surfaces.

Figure 7:
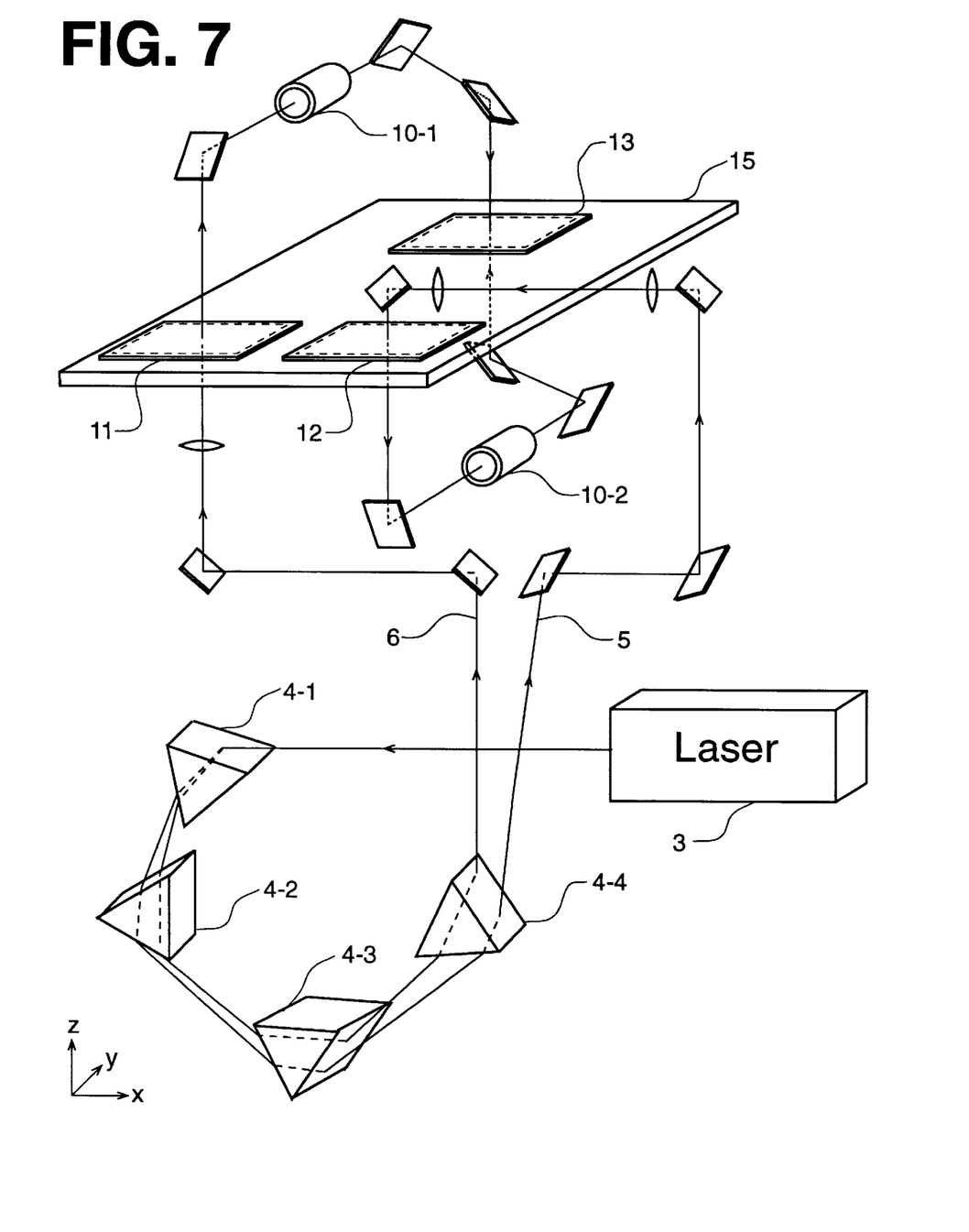
FIG. 7 shows how the invention is incorporated into a lithography system so that the two beams are used to pattern two different sides of a single substrate.

There are lithography systems which require a Xenon Fluoride laser system but they pattern on only one side of a large-area substrate. Rather than pattern two sides of one substrate, we could pattern one side each of two different substrates 19 and 20 to obtain an increase in throughput. FIG. 7 shows an embodiment of the invention in which the two beams 5 and 6 are used to illuminate two masks 16 and 17 mounted on one scanning platform 15. The masks 16 and 17 are imaged by two identical lithography lenses 18-1 and 18-2 to two different substrates 19 and 20 also mounted on the same scanning platform 15.

Figure 8:
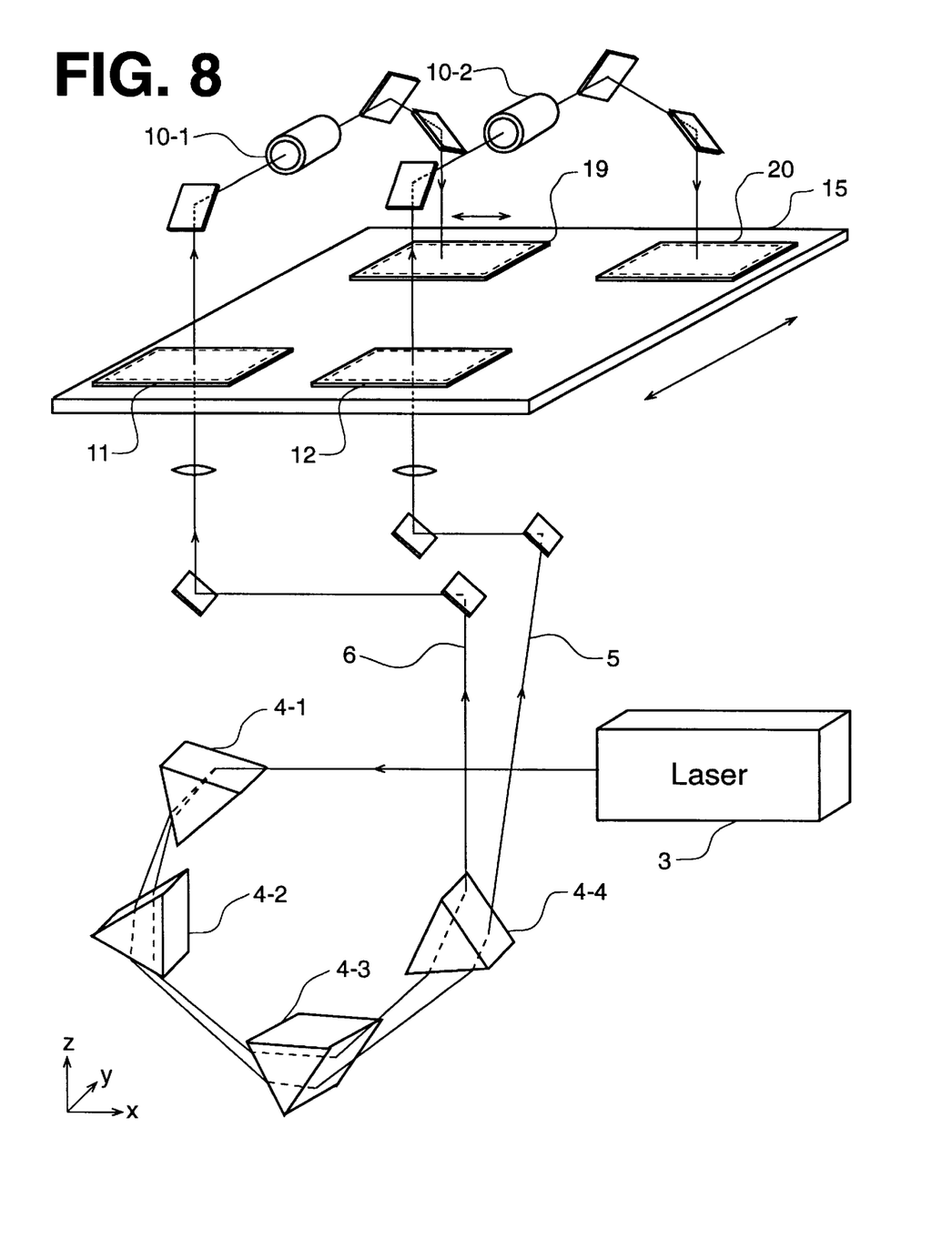
FIG. 8 shows how the invention is incorporated into a lithography system so that the two beams are used to pattern one side each of two different substrates mounted on a single scanning stage.
Figure 9:
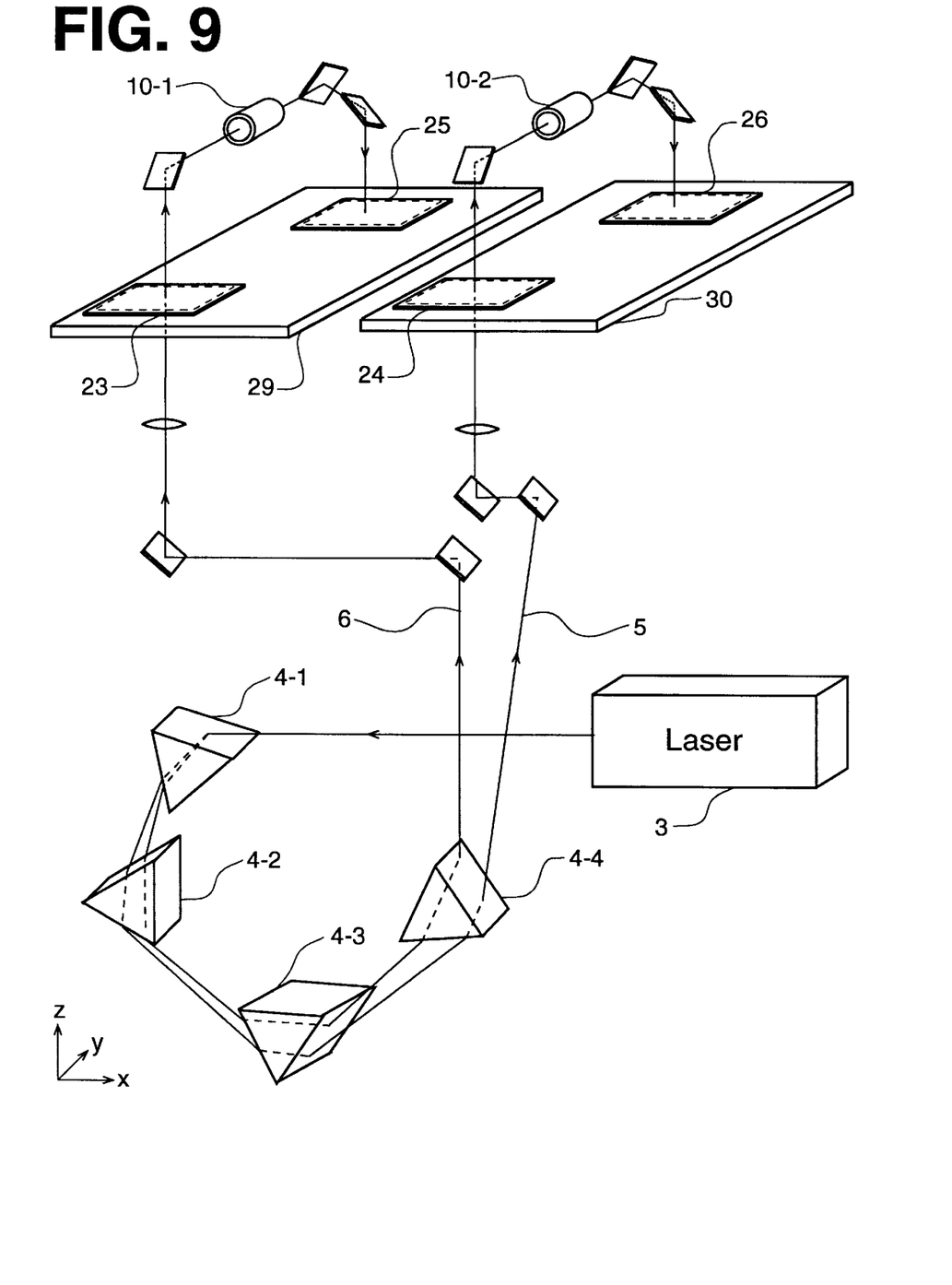
FIG. 9 shows how the invention is incorporated into a lithography system so that the two beams are used to pattern one side each of two different substrates mounted on different scanning stages.

It may be preferred to independently pattern the single-sided substrate by using two different scanning systems 29 and 30. FIG. 8 shows another embodiment of the invention in which each mask 23 and 24 and substrate 25 and 26 are mounted on their own scanning platform 29 and 30 on separate stages.

The technique of splitting the laser output spectrally rather than by using a beamsplitter offers many system advantages. The lens design and assembly is considerably simpler and more economical, since only one type of material is required to manufacture the lens. The risks associated with manufacturing the lens are also considerably reduced, since additional materials (other than fused silica) do not yet show the same level of homogeneity and low absorption that is available for fused silica. The manufacturing and characterization of the raw materials is much more mature for fused silica than for other materials such as Calcium Fluoride.

Splitting the laser output spectrally is also much more effective than other intra-cavity line narrowing techniques since these would significantly reduce the laser power output. Intra-cavity line-narrowing systems would also be subjected to high intra-cavity powers and be susceptible to damage. These systems are sensitive to environmental changes that would tend to shift the wavelength peak and may require active feedback control to maintain the peak wavelength at a constant.

What is claimed is:

1. A high-precision, high-throughput microelectronics imaging system for simultaneously patterning a plurality of substrate surfaces, utilizing a laser (3) and first and second projection means for directing emission from such laser (3) to provide patterning illumination for each substrate surface, all under control of control means, in which said laser (3) provides a single-beam broadband emission with a spectrum consisting of discrete multiple peaks, characterized by;

a) optical dispersion means (4-1, 4-2, 4-3, 4-4/8) arranged to accept said broadband emission as input from said laser (3), and provide as output multiple, physically separated, narrowband beams (5,6), including a first narrowband beam whose central wavelength corresponds to a first spectral peak of said broadband emission and a second narrowband beam whose central wavelength corresponds to a second spectral peak of said broadband emission;

b) first projection means, arranged to accept as input said first narrowband beam from said optical dispersion means (4-1, 4-2, 4-3, 4-4/8) and to direct said first narrowband beam (5) through said first projection means (10-2) for imaging a first substrate surface; and c) second projection means, arranged to accept as input said second narrowband beam from said optical dispersion means (4-1, 4-2, 4-3, 4-4/8) and to direct said second narrowband beam (6) through said second projection means (10-1) for imaging a second substrate surface.

2. A high-precision, high-throughput microelectronics imaging system according to claim 1, in which said laser (3) is a Xenon Fluoride excimer laser having an emission spectrum consisting of two spectral peaks at nominal wavelengths 351 nm and 353 nm.

3. A high-precision, high-throughput microelectronics imaging system according to claim 1, further characterized in that said optical dispersion means comprises prism means appropriately arranged to generate wavelength separation and resulting in a plurality of narrowband beams.

4. A high-precision, high-throughput microelectronics imaging system according to claim 3, further characterized in that said prism means is arranged in a compact curved path for separation of the narrowband beams in minimal physical space.

5. A high-precision, high-throughput microelectronics imaging system according to claim 1, further characterized in that said optical dispersion means comprises prism means appropriately arranged to generate two physically separate narrowband beams corresponding to spectral peaks at nominal wavelengths 351 nm and 353 nm.

6. A high-precision, high-throughput microelectronics imaging system according to claim 1, further characterized in that said optical dispersion means comprises prism means and reflective (7) means appropriately arranged to generate wavelength separation and physical separation, resulting in a plurality of narrowband beams which are reversed by said reflective means for an additional pass through said prism means for additional separation.

7. A high-precision, high-throughput microelectronics imaging system according to claim 1, further characterized in that said optical dispersion means comprises a set of at least one reflective diffraction grating (8) to divide the broadband emission output of said laser (3) into a finite number of narrowband beams.

8. A high-precision, high-throughput microelectronics imaging system according to claim 1, further characterized in that said first optical path means comprises a narrowband projection lens (10-1) for said first narrowband beam and said second optical path means comprises an identical narrowband projection lens (10-2) for said second narrowband beam.

9. A high-precision, high-throughput microelectronics imaging system according to claim 8, further characterized in that said identical projection lenses (10-1,10-2), are single-material lenses adapted for narrowband transmission within the range of the related spectral peaks of the broadband emission of said laser means (1).

10. A high-precision, high-throughput microelectronics imaging system for simultaneously processing a plurality of images, utilizing:

control means, a laser (3) providing a broadband spectral beam encompassing a plurality of narrowband spectral peaks, dispersion means for separating the broadband spectral beam into a plurality of separate narrowband spectral beams, a plurality of separate projection means for separately directing said separate narrowband beams to provide separate useful imaging beams, all under control of control means.

11. A high-precision, high-throughput microelectronics imaging system for simultaneously processing a plurality of images, according to claim 10 further characterized in that:

said dispersion means is a prism array arranged to accept said broadband beam as input from said laser (1), and provide as output a useful set of physically separated single-wavelength-peak narrowband beams.

12. A high-precision, high-throughput microelectronics imaging system for simultaneously processing a plurality of images, according to claim 10 further characterized in that:

said dispersion means is a prism array with a reflective surface redirecting said narrowband beams through said prism array, arranged to accept said broadband beam as input from said laser (1), and provide as output a useful set of physically separated single-wavelength-peak narrowband beams.

13. A high-precision, high-throughput microelectronics imaging system for simultaneously processing a plurality of images, according to claim 10 further characterized in that:

said dispersion means is a diffraction grating arranged to accept said broadband beam as input from said laser (1), and provide as output a useful set of physically separated single-wavelength-peak narrowband beams.

14. A high-precision, high-throughput microelectronics imaging system for simultaneously processing a plurality of images, having stage means, laser means, laser output processing means, a plurality of projection scanning means including first projection means and second projection means, and control means, further characterized in that:

a) said stage means is a single stage (15) carrying a plurality of masks (11,12) and a single substrate (13) which is to be patterned on opposing surfaces;

b) said laser means provides an output broadband spectral beam including a plurality of narrowband spectral peaks;

c) said laser output processing means includes optical dispersion means which separates said broadband spectral beam into separate narrowband beams corresponding to such peaks;

d) said first projection means includes a first mask (11) and first projection lens (10-1) together with beam directing means to provide an image on a first surface of said substrate (13) using a first one of said narrowband beams; and e) said second projection means includes a second mask (12) and second projection lens (10-2) together with beam directing means to provide an image on a second surface of said substrate (13) using a second one of said narrowband beams.

15. A high-precision, high-throughput microelectronics imaging system for simultaneously processing a plurality of images, having stage means, laser means, laser output processing means, a plurality of projection scanning means including first projection means and second projection means, and control means, further characterized in that:

a) said stage means is a single stage (15) carrying a plurality of masks (11,12) and a plurality of substrates, including first and second substrates (19,20), which are to be patterned on their surfaces;

b) said laser means provides an output broadband spectral beam including a plurality of narrowband spectral peaks;

c) said laser output processing means includes optical dispersion means which separates said broadband spectral beam into separate narrowband beams corresponding to such peaks;

d) said first projection means includes a first mask (11) and first projection lens (10-1) together with beam directing means to provide an image on a surface of said first substrate (19) using a first one of said narrowband beams; and e) said second projection means includes a second mask (12) and second projection lens (10-2) together with beam directing means to provide an image on a surface of said second substrate (20) using a second one of said narrowband beams.

16. A high-precision, high-throughput microelectronics imaging system for simultaneously processing a plurality of images, having stage means, laser means, laser output processing means, a plurality of projection scanning means including first projection means and second projection means, and control means, further characterized in that:

a) said stage means is a plurality of separate stages (29,30) carrying a plurality of masks (23,24) and a plurality of substrates, including first and second substrates (25, 26), which are to be patterned on their surfaces;

b) said laser means provides an output broadband spectral beam including a plurality of narrowband spectral peaks;

c) said laser output processing means includes optical dispersion means which separates said broadband spectral beam into separate narrowband beams corresponding to such peaks;

d) said first projection means includes a first mask (23) and first projection lens (10-1) together with beam directing means to provide an image on a surface of said first substrate (25) using a first one of said narrowband beams; and e) said second projection means includes a second mask (24) and second projection lens (10-2) together with beam directing means to provide an image on a surface of said second substrate (26) using a second one of said narrowband beams.

* * * * *